(12) United States Patent
Zhong et al.

(10) Patent No.: US 8,183,061 B2
(45) Date of Patent: May 22, 2012

(54) HIGH DENSITY SPIN-TRANSFER TORQUE MRAM PROCESS

(75) Inventors: Tom Zhong, Saratoga, CA (US);
Chyu-Jiuh Torng, Pleasanton, CA (US);
Rongfu Xiao, Fremont, CA (US); Adam Zhong, Milpitas, CA (US); Wai-Ming Johnson Kan, San Ramon, CA (US);
Daniel Liu, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 0 days.

(21) Appl. No.: 12/931,648

(22) Filed: Feb. 7, 2011

(65) Prior Publication Data

US 2011/0129946 A1    Jun. 2, 2011

Related U.S. Application Data

(62) Division of application No. 12/290,495, filed on Oct. 31, 2008, now Pat. No. 7,884,433.

(51) Int. Cl.
*H01L 21/441* (2006.01)

(52) U.S. Cl. ............. 438/3; 257/421; 257/E21.577; 257/E21.579; 438/637

(58) Field of Classification Search ............ 257/421, 257/774, E29.323, E23.145, E21.577, E21.579; 438/3, 637, 638
See application file for complete search history.

(56) References Cited

U.S. PATENT DOCUMENTS

| | | | |
|---|---|---|---|
| 6,784,091 B1 * | 8/2004 | Nuetzel et al. | 438/618 |
| 7,381,574 B2 * | 6/2008 | Kim et al. | 438/3 |
| 7,706,175 B2 | 4/2010 | Hosotani et al. | |
| 7,741,688 B2 | 6/2010 | Kajiyama | |
| 2002/0171100 A1 * | 11/2002 | Pohm | 257/310 |
| 2007/0297220 A1 | 12/2007 | Yoshikawa et al. | |
| 2008/0160643 A1 * | 7/2008 | Park et al. | 438/3 |
| 2009/0104718 A1 | 4/2009 | Zhong et al. | |
| 2010/0289098 A1 * | 11/2010 | Li et al. | 257/421 |

OTHER PUBLICATIONS

"Current-driven excitation of magnetic multilayers," by J.C. Slonczewski, Journal of Magnetism and Magnetic Materials, 159 (1996) L1-L7, Elsevier.

"Emission of spin waves by a magnetic multilayer taversed by a current," by L. Berger, Physical Review B, vol. 54, No. 13, Oct. 1, 1996-I, 1996 The American Physical Society, pp. 9353-9358.

* cited by examiner

*Primary Examiner* — Allan R Wilson
(74) *Attorney, Agent, or Firm* — Saile Ackerman LLC; Stephen B. Ackerman

(57) ABSTRACT

A STT-MRAM integration scheme is disclosed wherein the connection between a MTJ and CMOS metal is simplified by forming an intermediate via contact (VAC) on a CMOS landing pad, a metal (VAM) pad that contacts and covers the VAC, and a MTJ on the VAM. A dual damascene process is performed to connect BIT line metal to CMOS landing pads through VAC/VAM/MTJ stacks in a device region, and to connect BIT line connection pads to CMOS connection pads through BIT connection vias outside the device region. The VAM pad is a single layer or composite made of Ta, TaN, or other conductors which serves as a diffusion barrier, has a highly smooth surface for MTJ formation, and provides excellent selectivity with refill dielectric materials during a chemical mechanical polish process. Each VAC is from 500 to 3000 Angstroms thick to minimize additional circuit resistance and minimize etch burden.

11 Claims, 4 Drawing Sheets

HIGH DENSITY SPIN-TRANSFER TORQUE MRAM PROCESS

This is a Divisional application of U.S. patent application Ser. No. 12/290,495, filed on Oct. 31, 2008 now U.S. Pat. No. 7,884,433, which is herein incorporated by reference in its entirety, and assigned to a common assignee.

RELATED PATENT APPLICATION

This application is related to the following: Ser. No. 11/975,045, filing date Oct. 17, 2007; assigned to a common assignee and herein incorporated by reference in its entirety.

FIELD OF THE INVENTION

The invention relates to an integration scheme for a high density spin-transfer torque (STT) MRAM device and a method of forming the same that significantly improves final production yield and simplifies overall integration capability.

BACKGROUND OF THE INVENTION

Magnetoresistive Random Access Memory (MRAM), based on the integration of silicon based Complementary Silicon-Oxide Semiconductor (CMOS) with magnetic tunnel junction (MTJ) technology, is now a proven non-volatile memory technology with many advantages in terms of writing/read speed, power consumption, and lifetime over other commercialized memory types including SRAM, DRAM, Flash, etc. However, conventional MRAM has a fundamental limitation of scalability. STT-MRAM not only possesses the major benefits of conventional MRAM but also has tremendous potential for scalability. Unlike conventional MRAM that requires a separate word line in addition to a BIT line to switch the magnetization direction of a free layer in a MTJ, STT-MRAM relies only on a current passing through the MTJ to rotate the free layer magnetization direction. In order for STT-MRAM to switch a bit, however, the current density passing through the MTJ should be larger than a critical switching current density (Jc). Since current density is inversely proportional to device physical size given a fixed amount of current, the switching efficiency increases as the critical dimension (CD) size of the MTJ decreases. Thus, CD is normally quite small for a STT-MRAM and is typically less than 100 nm.

A MTJ element may be based on a tunneling magneto-resistance (TMR) effect wherein a stack of layers has a configuration in which two ferromagnetic layers are separated by a thin non-magnetic dielectric layer. In a MRAM device, the MTJ element is formed between a bottom electrode such as a first conductive line and a top electrode which is a second conductive line. A MTJ stack of layers that is subsequently patterned to form a MTJ element may be formed in a so-called bottom spin valve configuration by sequentially depositing a seed layer, an anti-ferromagnetic (AFM) pinning layer, a ferromagnetic "pinned" layer, a thin tunnel barrier layer, a ferromagnetic "free" layer, and a capping layer. The AFM layer holds the magnetic moment of the pinned layer in a fixed direction. In a MRAM MTJ, the free layer is preferably made of NiFe because of its reproducible and reliable switching characteristics as demonstrated by a low switching field (Hc) and switching field uniformity (σHc). Alternatively, a MTJ stack of layers may have a top spin valve configuration in which a free layer is formed on a seed layer followed by sequentially forming a tunnel barrier layer, a pinned layer, AFM layer, and a capping layer.

The pinned layer has a magnetic moment that is fixed in the "x" direction, for example, by exchange coupling with the adjacent AFM layer that is also magnetized in the "x" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. In a read operation, when a sense current is passed from the top electrode to the bottom electrode in a direction perpendicular to the MTJ layers otherwise known as a current perpendicular to plane (CPP) configuration, a lower resistance is detected when the magnetization directions of the free and pinned layers are in a parallel state ("1" memory state) and a higher resistance is noted when they are in an anti-parallel state or "0" memory state.

During a write operation, information is written to the MRAM cell by changing the magnetic state in the free layer from a "1" to a "0" or from a "0" to a "1". In conventional MRAM, this process is accomplished by generating external magnetic fields as a result of applying bit line and word line currents in two crossing conductive lines, either above or below the MTJ element. Alternatively, in STT-MRAM, spin torque magnetization switching is used. Spin transfer (spin torque) magnetization switching has been described by J. Sloneczewski in "Current-driven excitation of magnetic multilayers", J. Magn. Materials V 159, L1-L7 (1996), and by L. Berger in "Emission of spin waves by a magnetic multiplayer traversed by a current" in Phys. Rev. Lett. B, Vol. 52, p. 9353. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-MRAM (also known as Spin-RAM) and a conventional MRAM is only in the write operation mechanism. The read mechanism is the same.

A critical current for spin transfer switching (Ic), which is defined as $[(Ic^{+}+I\ Ic^{-})/2]$, for a 180 nm node sub-micron MTJ having a top-down area of about 0.2×0.4 micron, is generally a few milliamperes. The critical current density (Jc), for example (Ic/A), is on the order of several $10^7$ A/cm$^2$. This high current density, which is required to induce the spin-transfer effect, could destroy a thin insulating barrier made of AlOx, MgO, or the like. In order for spin-transfer magnetization switching to be viable in the 90 nm technology node and beyond, the critical current density (Jc) must be lower than $10^6$ A/cm$^2$ to be driven by a CMOS transistor that can typically deliver 100 μA per 100 nm gate width.

To apply spin-transfer switching to MRAM technology, it is desirable to decrease Ic (and its Jc) by more than an order of magnitude so as to avoid an electrical breakdown of the MTJ device and to be compatible with the underlying CMOS transistor that is used to provide switching current and to select a memory cell.

The fabrication process of a STT-MRAM is very challenging because of the small MTJ size where both easy-axis and hard axis dimensions must be controlled for optimum performance. There are two major challenges in a vertical integration scheme for a STT-MRAM. The first challenge is the CD control of MTJ size and the MTJ etching process. The second challenge is fabrication of the interface between the CMOS metal layer to a MTJ without causing any defect related issues. The first challenge was addressed in related MagIC patent application Ser. No. 11/975,045 which described a two mask process for forming a MTJ. However, an improved integration scheme for an STT-MRAM that emphasizes a better CMOS metal interface with a MTJ cell is still needed for a production worthy manufacturing process.

A routine search of the prior art was conducted and the following references were found. In U.S. Patent Application Publication 2008/0089118, a method of forming a wiring to a MTJ element is shown. The MTJ is formed on a bottom electrode that is connected to a source region of a transistor through a contact. The free layer has a ring shape with an insulator layer formed in the center of the ring.

U.S. Patent Application Publication 2008/0080233 discloses a method of making connections to a MTJ element using a hard mask and copper vias. The MTJ contacts the top surface of a first wiring layer

SUMMARY OF THE INVENTION

One objective of the present invention is to provide an integration scheme for a STT-MRAM device that reduces defect issues associated with one of the intermediate steps of connecting a MTJ element to a CMOS metal pad.

A second objective of the present invention is to provide a process flow for fabricating a STT-MRAM that improves final product yield.

According to the present invention, these objectives are achieved by a fabrication sequence that sequentially forms a device array of via contacts (VAC) on the uppermost CMOS metal layer in a substrate, a metal pad (VAM) on each active VAC in the device array, and a MTJ with an overlying hard mask formed on each active VAM/VAC stack. Thus, the VAM serves as a metal separation layer and has a smooth, flat surface to enable smooth and flat layers in the MTJ for optimum performance. A dual damascene process is used to connect the BIT metal layer to CMOS connection pads. BIT lines are also formed on each MTJ/VAM/VAC stack thereby connecting a BIT line to a CMOS metal landing pad and enabling read and write processes in the STT-MRAM device.

In one aspect, the uppermost CMOS metal layer includes an array of CMOS metal landing pads in a device region and a plurality of CMOS metal connection pads outside the device array. A first dielectric layer is formed coplanar with the CMOS metal landing pads and connection pads and separates adjacent metal features. Thereafter, a first etch stop layer and a second (VAC) dielectric layer are sequentially deposited on the first dielectric layer and uppermost CMOS metal layer. A conventional single damascene process is employed to form a VAC in the VAC dielectric layer and first etch stop layer above each CMOS metal landing pad in the device array. Each VAC is electrically connected through a CMOS landing pad to a transistor in a sub-structure. An intermediate separation metal layer is deposited on the VAC dielectric layer and array of VACs, and is patterned to give a plurality of metal pads (VAM) in which each VAM pad contacts the top surface of an underlying VAC. From a top view, the area of a VAM pad is larger than that of a VAC to ensure that the metal pad completely covers an underlying VAC. A VAM dielectric layer is deposited to fill the openings between adjacent VAM pads and is then planarized to become coplanar with the VAM pads. Next a MTJ is formed on each VAM pad by depositing a stack of MTJ layers on the VAM dielectric layer and on the VAM pads and patterning the MTJ stack.

In one embodiment, the MTJ stack has a bottom spin valve configuration in which a seed layer, AFM layer, synthetic anti-ferromagnetic (SyAF) pinned layer, tunnel barrier layer, free layer, and a composite capping layer made of a hard mask spacer layer and an uppermost hard mask layer are sequentially formed on the substrate. All of the layers in the MTJ stack may be formed by sputtering or ion beam deposition (IBD). Thereafter, the MTJ stack of layers may be annealed in an easy-axis direction, hard-axis direction, or along both easy-axis and hard-axis directions. The fabrication sequence comprises at least one photolithography step and at least one etch step to form a patterned MTJ element above each VAM pad. A MTJ ILD layer is deposited on the MTJ array and is planarized to become coplanar with the plurality of MTJs. In the following steps, a second etch stop layer and a BIT dielectric layer (BIT ILD) are sequentially deposited on the MTJ ILD and array of MTJs. A via pattern is formed in the BIT ILD, second etch stop layer, MTJ ILD, and VAC dielectric layer to expose portions of the first etch stop layer above a CMOS connection pad. A trench is then formed in the BIT ILD layer above the via pattern and a trench is formed above each MTJ in the device array as part of a dual damascene sequence. The etch process that defines the trenches also etches through the first etch stop layer in the via pattern to expose portions of the CMOS connection pad. Then a diffusion barrier layer and BIT metal layer are deposited in the vias and trenches to form BIT connection vias and BIT line connection pads above each CMOS connection pad, and a BIT line above each MTJ to form an electrical connection with an underlying CMOS landing pad through the MTJ/VAM/VAC stack

DETAILED DESCRIPTION OF THE INVENTION

The present invention is an integration scheme for fabricating a STT-MRAM device that can significantly improve final production yield. The integration scheme includes a process flow that can be readily implemented in a manufacturing environment. Although the exemplary embodiment describes a bottom spin valve MTJ element, the present invention also encompasses other STT-MRAM designs including dual spin valve (DSF) configurations and top spin valve elements. The drawings are not necessarily drawn to scale and the relative sizes of various elements may differ from those in an actual device.

Figure 1:
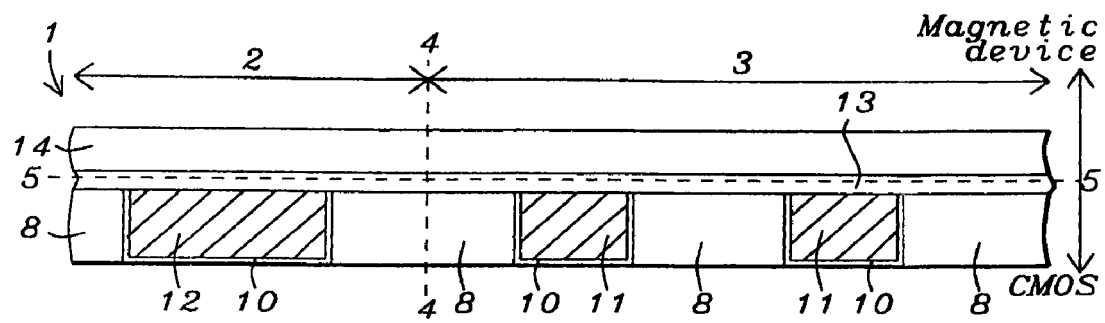
FIG. 1 is a cross-sectional view showing an intermediate step during the formation of a STT-MRAM according to the present invention in which a first etch stop layer and a VAC dielectric layer are coated on a CMOS metal layer.

A method of forming a STT-MRAM structure according to one embodiment of the present invention will now be described. Referring to FIG. 1, a partially completed STT-MRAM structure 1 is shown that includes a substrate comprised of a first dielectric layer 8 and an uppermost CMOS metal layer that includes a plurality of CMOS metal landing pads 11 in a device region 3 and a plurality of CMOS connection pads 12 in a region 2 outside the device region. Only one CMOS connection pad 12 is depicted in order to simplify the drawing. There is a CMOS metal landing pad 11 for each individual active MTJ element to be formed in the device area during subsequent process steps. In an alternative embodiment, CMOS connection pads 12 may be in the form of metal line shapes (not shown). First dielectric layer 8 may be comprised of aluminum oxide, silicon oxide, or other insulation materials. The plane 4-4 is used only for illustration purposes to denote the boundary between regions 2 and 3. It should be understood that in an actual device there are a plurality of regions 2, 3 having various shapes from a top-down view (not shown) which cannot be separated by a single plane. In FIG. 1, the drawing is simplified to focus on the critical elements of the present invention. There is preferably a diffusion barrier layer 10 along the bottom and side surfaces of CMOS metal landing pads 11 and CMOS connection pad 12 to prevent metal diffusion into the adjoining first dielectric layer 8. Typically, the CMOS metal landing pads 12 are made of Cu and are electrically connected to a transistor in a sub-structure (not shown).

A first etch stop layer 13 and a second dielectric layer 14 are sequentially formed by conventional methods on the CMOS metal layer and first dielectric layer 8. A plane 5-5 is shown that separates the CMOS section of the device from the magnetic section of the device 1. First etch stop layer 13 has a thickness between 300 Angstroms to 1500 Angstroms and may be made of silicon nitride or SiCN depending on the size of the photoresist features printed in a subsequent lithography process to form openings in the second dielectric layer 14. For example, SiCN is normally preferred for a 90 nm technology. Second dielectric layer 14 is generally made of silicon oxide but may be comprised of other insulation materials known by those skilled in the art.

Figure 2:
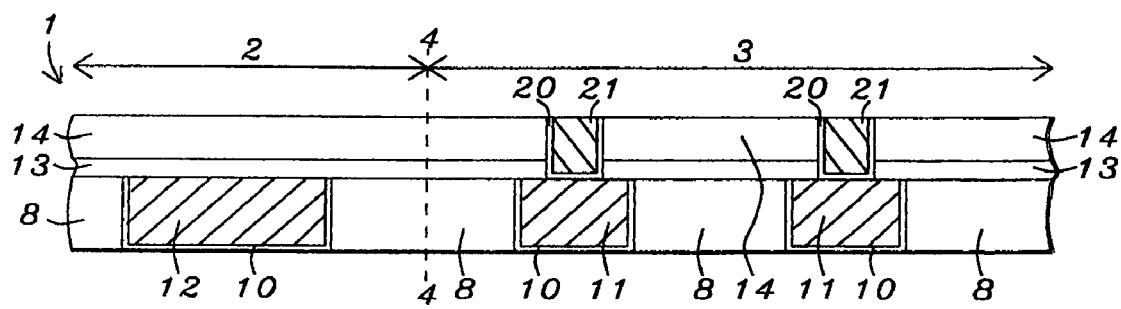
FIG. 2 is cross-sectional view of the partially formed STT-MRAM in FIG. 1 after an intermediate via contact (VAC) is formed in the VAC dielectric layer and contacts each CMOS landing pad in the device array.

Referring to FIG. 2, an intermediate via contact (VAC) 21 is formed above each CMOS landing pad by a single damascene method. For example, a photoresist layer is coated on the second dielectric layer 14 and is patterned to form an array of openings (not shown) such that there is an opening above each CMOS landing pad 11. A reactive ion etch (RIE) step may be performed to transfer the openings through underlying portions of the second dielectric layer 14 and first etch stop layer 13. Then a diffusion barrier layer 20 may be deposited to conformally line the openings before a VAC metal layer is deposited on the diffusion barrier layer. In one embodiment, the VAC metal layer is comprised of Cu that is deposited by an electroplating method. A planarization process which is preferably a chemical mechanical polish (CMP) method is employed to make the VACs 21 coplanar with second dielectric layer 14. Note that a plurality of dummy VACs (not shown) may be formed during the same process sequence that produces active VACs 21 in order to assist the CMP procedure in forming uniformly thick VACs across the substrate. The dummy VACs are formed coplanar with VACs 21 but are not aligned above CMOS metal landing pads 11.

Since the only function of active VACs 21 is for electrically connecting MTJs formed in a subsequent step to the CMOS metal landing pads 11, the VACs should be as thin as possible, preferably 500 Angstroms to 3000 Angstroms thick, to minimize the amount of additional resistance added to the circuit and to minimize the etch burden that can arise if the aspect ratio (height/width ratio of VAC opening) is too large to permit an adequate lithography process window during the photoresist patterning step. The advantage of inserting the VACs 21 is to separate identical via patterns from other patterns. In other words, one needs to deal with only one type of via pattern during the critical MTJ layer patterning where a MTJ is aligned above each active VAC 21 as described in a later section.

Figure 3:
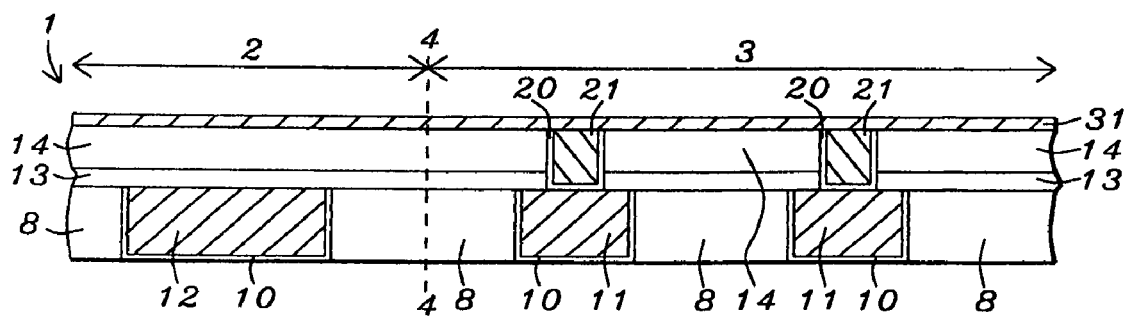
FIG. 3 is a cross-sectional view of the partially formed STT-MRAM in FIG. 2 after a metal separation layer is formed on the VAC dielectric layer and contacts the top surfaces of the VACs in the device array.

In FIG. 3, a metal separation layer (VAM) 31 is deposited on the second dielectric layer 14 and plurality of VACs 21 by a physical vapor deposition (PVD) or the like. The VAM layer preferably has the following properties: (1) good barrier to prevent Cu diffusion from a VAC 21 into an overlying MTJ; (2) highly uniform (smooth) to enable smooth and flat MTJ layers to be formed thereon; and (3) excellent CMP selectivity between the VAM layer and adjoining VAM dielectric layer 14a (FIG. 4) so that a uniformly thick and flat surface can be obtained on the patterned VAM pads 31p. VAM layer 31 may be a single layer or a composite comprised of one or more of Ta, TaN, or other conductive materials with a thickness in the range of 100 Angstroms to 500 Angstroms.

Figure 4:
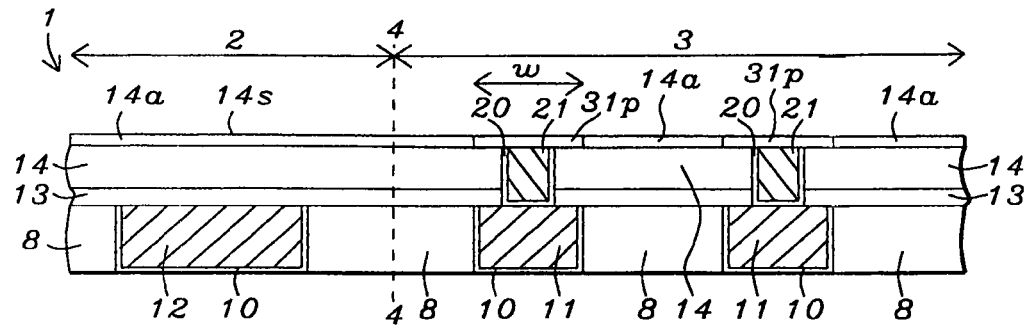
FIG. 4 is a cross-sectional view of the STT-MRAM structure in FIG. 3 following a process that etches the metal separation layer to form VAC cover metal pads (VAM) which contact the top surface of each active VAC.

Referring to FIG. 4, the partially formed STT-MRAM 1 is depicted after the VAM layer is patterned to form a plurality of VAM pads 31p in the device region 3. From a top view (not shown), the VAM pads 31p may be circular, oval, rectangular, or other shapes and preferably have an area size greater than that of the underlying VAC 21 to ensure that the VAC is completely covered by the VAM pad. Thus, from a side view perspective in FIG. 4, the width w of a VAM pad 31p is sufficiently large to cover the underlying VAC 21. The present invention anticipates that a plurality of dummy VAM pads may be formed in the VAM layer during the same process steps that form VAM pads 31p. Dummy VAM pads are used to assist in achieving more uniform VAM pads 31p during a CMP process which planarizes the VAM layer with an adjoining VAM dielectric layer 14a. However, the dummy VAM pads are not electrically connected to a CMOS landing pad 11 and are not shown to simplify the drawing.

VAM layer 31 patterning is achieved by coating and patterning a photoresist layer on the VAM layer to form an array of openings (not shown) such that the openings uncover regions of the VAM layer that will be removed in the following RIE step. The RIE process removes unprotected regions of VAM layer 31 and stops on second dielectric layer 14.

Next, a VAM dielectric layer 14a is deposited on second dielectric layer 14 and VAM pads 31 followed by a CMP process to coplanarize the VAM dielectric layer 14a and VAM pads 31p. In one aspect, the VAM dielectric layer 14a may be made of the same material as in second dielectric layer 14. Optionally, the insulation material in second dielectric layer 14 may be different than that in VAM dielectric layer 14a. As indicated previously, a plurality of dummy VAM pads may be formed during the VAM layer patterning sequence in order to ensure excellent VAM pad 31p thickness uniformity across the substrate and to improve flatness on each active VAM pad 31p following the VAM CMP process. Dummy VAM pads are made from VAM layer 31 and are formed coplanar with VAM pads 31p.

Figure 5:
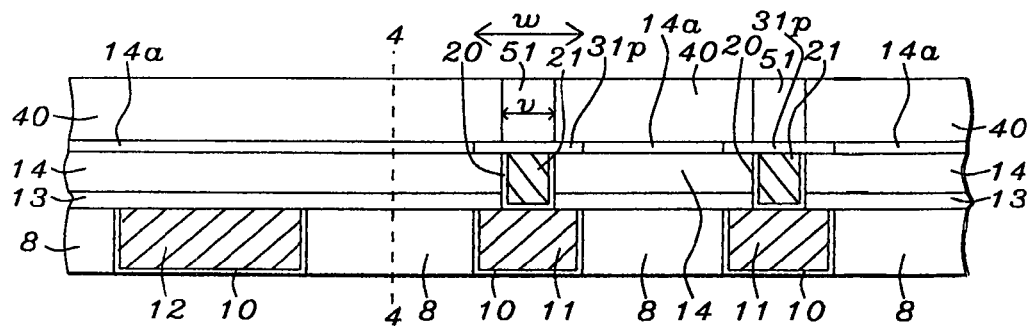
FIG. 5 is a cross-sectional view of the STT-MRAM structure in FIG. 4 after a MTJ is formed above each VAM/VAC stack and within a MTJ ILD layer.

Referring to FIG. 5, an MTJ stack of layers is now formed on the VAM dielectric layer 14a and on VAM pads 31p. Individual layers within the MTJ stack are not shown since the present invention encompasses a variety of configurations including bottom spin valve, top spin valve, and dual spin valve structures. Preferably, the MTJ stack has an uppermost capping layer comprised of a hard mask. In one embodiment, the MTJ stack has a bottom spin valve configuration in which a seed layer, AFM layer, synthetic anti-ferromagnetic (SyAF) pinned layer, tunnel barrier layer, free layer, and a composite capping layer made of a hard mask spacer layer and an uppermost hard mask layer are sequentially formed on the VAM dielectric layer 14a and VAM pads 31p. The hard mask spacer layer may be NiCr or MnPt and the hard mask layer may be Ta, for example.

The MTJ stack may be formed in the same process tool as the VAM 31 layer. For instance, the VAM layer 31 and MTJ stack may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. The MTJ stack of layers may be formed after a single pump down of the sputter system to enhance throughput.

The present invention also encompasses an annealing step after all of the MTJ layers have been deposited. For example, in the exemplary embodiment, the MTJ stack of layers may be annealed in a vacuum by applying a magnetic field of 10K Oe in magnitude along the easy axis for 1 to 5 hours at a temperature of about 250° C. to 300° C. An anneal process may also be performed along a hard-axis direction.

The MTJ stack is patterned by a process that includes at least one photolithography step and one etching step to form a plurality of MTJ elements 51. In one embodiment, a photoresist layer is coated on the uppermost layer in the MTJ stack and is patterned to form an array of islands having the intended shape of the MTJ elements to be formed in the following etch process. Thereafter, during a first etch step, the photoresist layer serves as an etch mask as the pattern is transferred through the hard mask and stops on the hard mask spacer layer. During a second etch step, the hard mask serves as the etch mask as the pattern in the hard mask layer is transferred through the hard mask spacer and underlying layers in the MTJ stack. It is important to select hard mask spacer and hard mask materials such as those mentioned previously that provide excellent etch selectivity between the hard mask layers and underlying MTJ layers and provide excellent CMP selectivity between the hard mask and the MTJ ILD layer that is deposited once the MTJ patterning is complete. The present invention also anticipates that two lithography steps may be used to independently define the x-axis and y-axis dimension of the MTJ shape as described in related MagIC application Ser. No. 11/975,045. In an alternative embodiment when two lithography processes are employed to define the MTJ element, a top portion of the MTJ may have a narrower width and smaller area size from a top view than a bottom portion of the MTJ.

A MTJ 51 is formed on each VAM pad 31 and is electrically connected to a CMOS landing pad 11 through a VAM pad 31p and a VAC 21. Although the exemplary embodiment depicts the MTJ 51 as having a width v less than the width w of the VAM pad 31p, the present invention also encompasses an embodiment where $v \geq w$. Moreover, there may be a plurality of dummy MTJ elements formed during the MTJ patterning sequence in order to improve the MTJ thickness uniformity during a later CMP step that involves planarizing the uppermost layer in the MTJ 51. The dummy MTJ elements are formed coplanar with MTJs 51 but are not electrically connected to a CMOS landing pad 11. The shape of MTJ 51 from a top view perspective may be circular, oval, or other shapes used by those skilled in the art.

In the following step, a MTJ ILD layer 40 comprised of a dielectric material such as aluminum oxide, silicon oxide, or a low k material known in the art is deposited on the MTJ 51 array and on the VAM dielectric layer 14a by a PVD method or the like. A CMP process is performed to make the MTJ ILD layer 40 coplanar with MTJs 51. As a result of the fabrication sequence described herein, the plurality of MTJ elements 51 formed on the VAM pads 31 will have a more uniform shape and smoother surface, and improved performance than achieved by a conventional MTJ fabrication method used in constructing a standard MRAM device. The method of the present invention is especially advantageous when at least one of the hard-axis dimension and easy-axis dimension of the MTJs 51 is about 100 nm or less.

Figure 6:
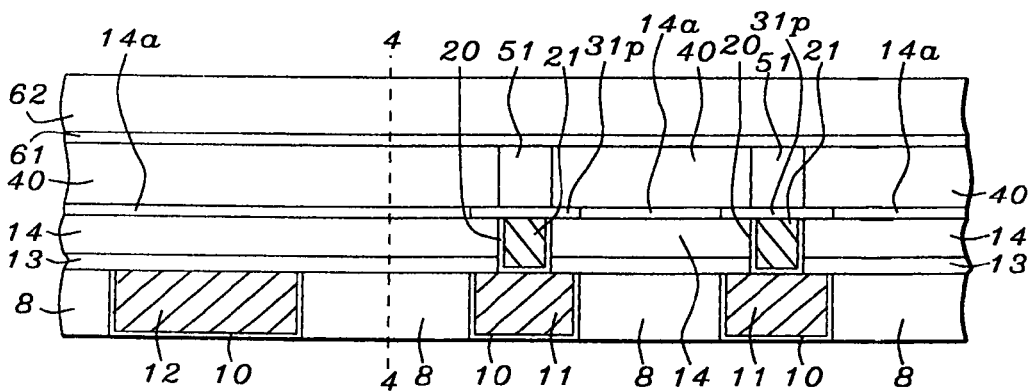
FIG. 6 is a cross-sectional view after a second etch stop layer and a BIT ILD layer are successively formed above the MTJs and MTJ ILD layer in FIG. 5.

Referring to FIG. 6, a second etch layer 61 and a BIT ILD layer 62 are sequentially laid down on the MTJ ILD layer 40 and on MTJs 51. The second etch stop layer 61 is preferably silicon nitride having a thickness from 300 Angstroms to 1000 Angstroms while the BIT ILD layer 62 is typically 1000 to 5000 Angstroms thick and is comprised of silicon oxide although other dielectric materials are also acceptable.

Figure 7:
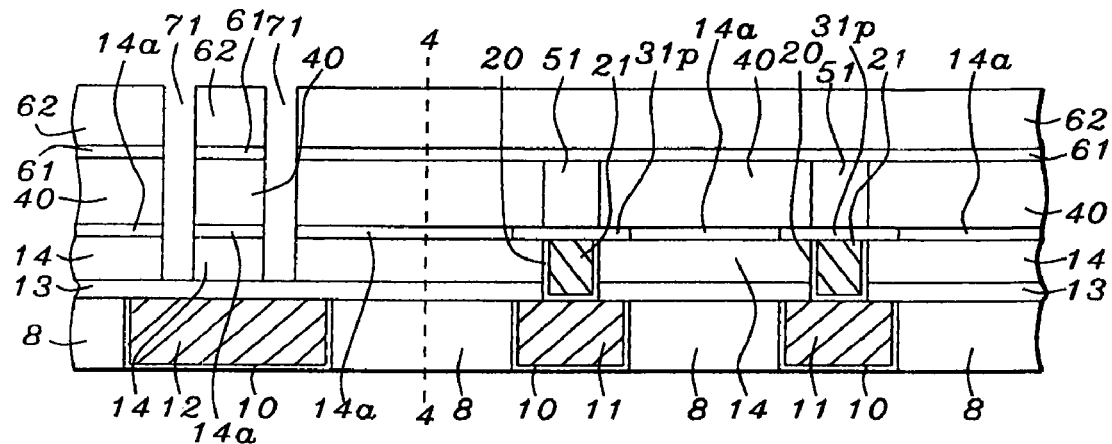
FIG. 7 is a cross-sectional view after a BIT connection via pattern is formed in the BIT ILD, second etch stop layer, MTJ ILD, and VAC dielectric layer above a CMOS connection pad according to one embodiment of the present invention.

In FIG. 7, the partially formed STT-MRAM 1 is shown after a via pattern comprised of via openings is formed that uncovers portions of the first etch stop layer 13 above CMOS connection pad 12. A conventional process is used that includes patterning a photoresist layer (not shown) on the BIT ILD layer 62 and an etch transfer through the BIT ILD layer, second etch stop layer 61, MTJ ILD layer 40, VAM dielectric layer 14a, and second dielectric layer 14. In the exemplary embodiment, two via openings 71 are formed above each CMOS connection pad 12. However, there may be other embodiments where one or more than two via openings are fabricated above each CMOS connection pad 12.

Figure 8:
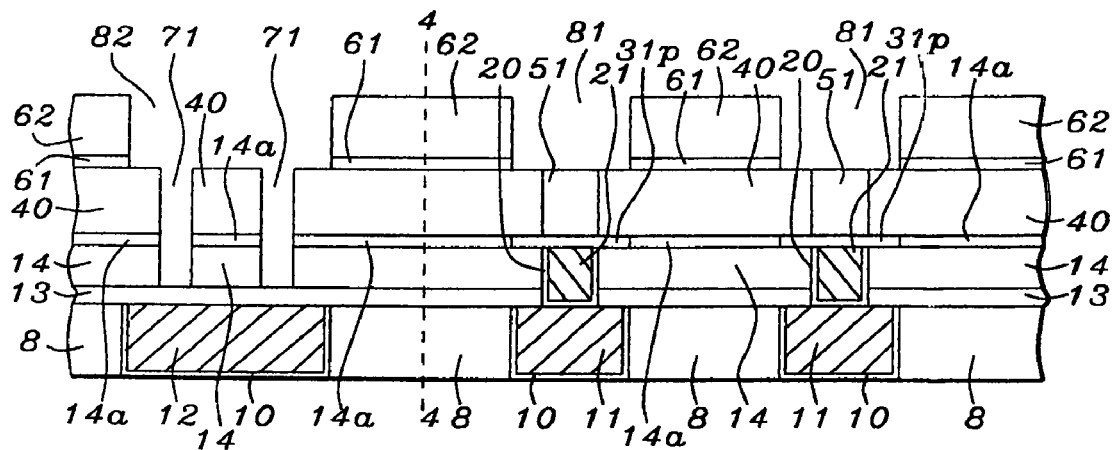
FIG. 8 is a cross-sectional view of the STT-MRAM structure in FIG. 7 following formation of a trench above the BIT connection via pattern and a trench above each active MTJ in the device area.

Referring to FIG. 8, a second patterning and etch sequence is used to delineate a first array of trenches including trench 82 in the BIT ILD layer 62 that extends through second etch stop layer 61. The etch process that opens trench 82 also removes exposed portions of the first etch stop layer 13 and uncovers portions of CMOS connection pad 12. In one embodiment, a trench 82 is formed above via openings 71 and a second array of trenches comprising a plurality of trenches 81 is formed in the device array such that one trench 81 is formed above each active MTJ 51 and exposes the entire top surface of the underlying MTJ.

Figure 9:
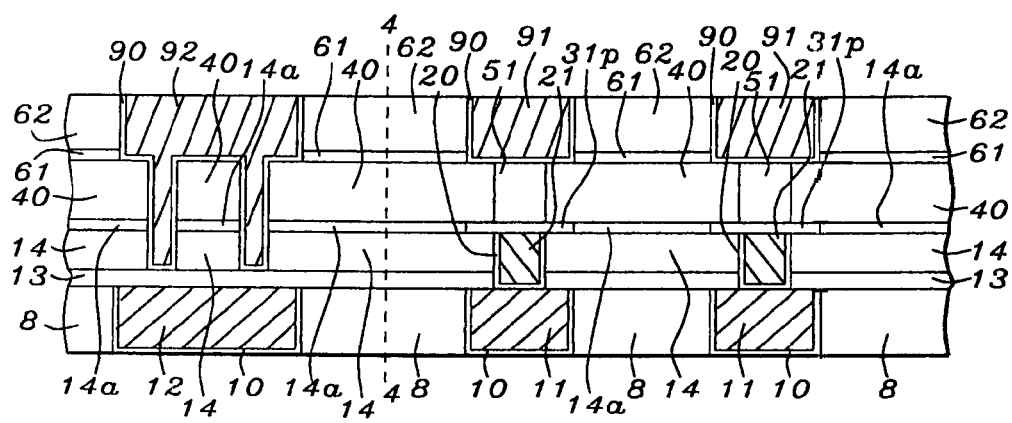
FIG. 9 is a cross-sectional view showing that the via pattern and trenches in FIG. 8 are filled with metal as a result of a dual damascene process to form BIT lines above each MTJ/VAM/VAC stack and a BIT line connection pad and BIT connection vias above each connection pad in the CMOS metal layer.
Figure 9:
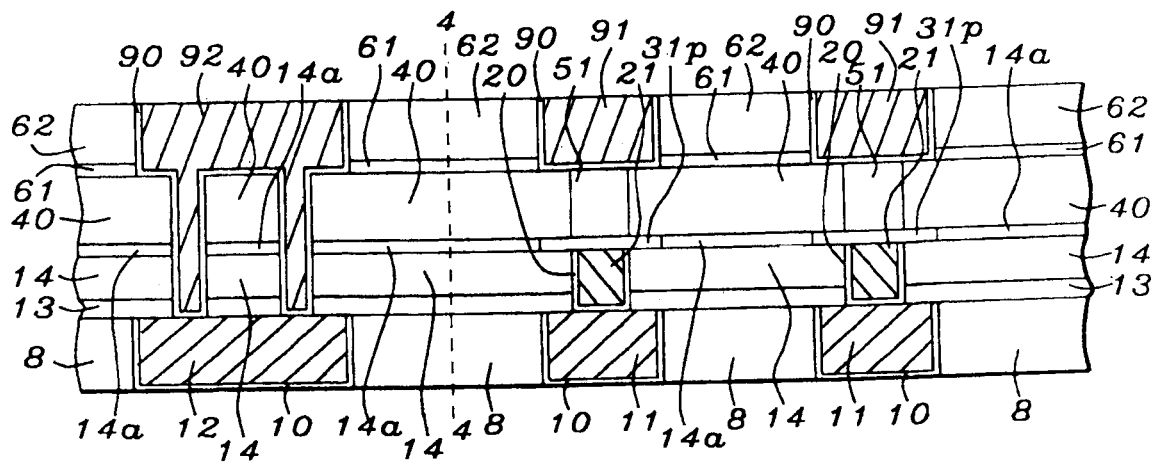

FIG. 9 shows a cross-sectional view of the completed STT-MRAM device 1 after a series of process steps including deposition of a diffusion barrier layer 90 to line the trenches 81, 82 and via openings 71, metal deposition to fill the trenches and via openings and form via contacts 93 between BIT line 92 and CMOS connection pads 12 as well as a BIT line 91 above each MTJ 51, and a CMP process to coplanarize the BIT lines 91, 92 with the BIT ILD layer 62.

The integration scheme described herein and the process flow employed to form the STT-MRAM structure as depicted in the embodiments of the present invention can significantly improve overall production yield and simplify integration capability of the magnetic device with a sub-structure including the upper most CMOS metal layer. The improved CMOS metal interface with MTJs through the VAC and VAM connection elements will lead to a shorter circuit with lower resistance and lower power consumption. Moreover, the higher degree of smoothness on the top surfaces of the VAM pads affords higher performing MTJ cells and fewer MTJ defects during MTJ patterning and planarization processes. For example, the TMR ratio (dR/R) is expected to be in a significantly narrower range for the plurality of MTJs 51 because of smoother and more uniform thicknesses across the substrate. As a result, device performance will increase and a lower rejection rate will decrease overall production cost compared to STT-MRAM design that do not incorporate the design improvements described herein.

While this invention has been particularly shown and described with reference to, the preferred embodiment thereof, it will be understood by those skilled in the art that various changes in form and details may be made without departing from the spirit and scope of this invention.

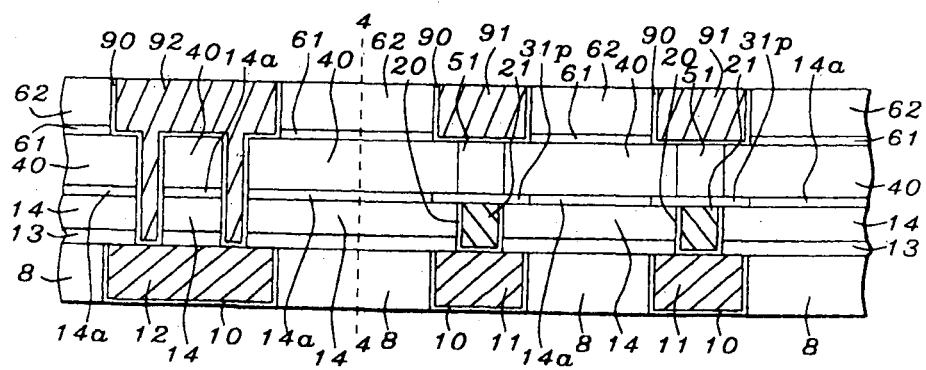

We claim:

1. A method of fabricating a STT-MRAM on a substrate having a CMOS metal layer including a plurality of CMOS landing pads in a device region and a plurality of CMOS connection pads outside the device region that are separated by and are coplanar with a first dielectric layer, comprising:

(a) sequentially forming a first etch stop layer and a second dielectric layer on the first dielectric layer and CMOS metal layer;

(b) forming a plurality of intermediate via contacts (VAC) each having a first width within the first etch stop layer and second dielectric layer in the device region wherein each of said VAC is in electrical contact with an underlying CMOS landing pad, and has a top surface coplanar with said second dielectric layer;

(c) forming a plurality of metal separation (VAM) pads on the second dielectric layer and separated by openings wherein each of said VAM pads has a second width greater than said first width and a bottom surface contacting and completely covering a top surface of a VAC, and forming a VAM dielectric layer that is coplanar with a top surface of each VAM pad and fills the openings between the VAM pads;

(d) forming a plurality of MTJ elements each having a bottom surface that contact a top surface of an underlying VAM pad and a top hard mask surface, said MTJ elements are separated by openings that are subsequently filled with a MTJ ILD layer which is then planarized to be coplanar with said top hard mask surface;

(e) sequentially depositing a second etch stop layer and a BIT ILD layer on the MTJ ILD layer and plurality of MTJ elements; and (f) performing a dual damascene process, comprising:

(1) forming a plurality of BIT connection via openings in the BIT ILD layer that extend through the second etch stop layer, MTJ ILD layer, VAM dielectric layer, and second dielectric layer and stop on the first etch stop layer above each of the plurality of CMOS connections pads;

(2) simultaneously forming a plurality of a first trenches in the BIT ILD layer and second etch stop layer outside the device region wherein each first trench connects with at least one BIT connection via opening, removing the first etch stop layer exposed by BIT connection via openings above the CMOS connection pads, and forming a plurality of second trenches in the BIT ILD layer and second etch stop layer in the device region wherein each second trench uncovers a top hard mask surface of a MTJ; and (3) depositing a conformal diffusion barrier layer within the first trenches, second trenches, and in the plurality of BIT connection vias, depositing a BIT metal layer on the conformal diffusion barrier layer to fill the plurality of first and second trenches and plurality of BIT connection vias, and planarizing the BIT metal layer to become coplanar with the BIT ILD layer.

2. The method of claim 1 wherein the first etch stop layer is comprised of silicon nitride or SiCN and has a thickness between about 300 and 1500 Angstroms, and the second etch stop layer is comprised of silicon nitride and has a thickness from about 300 to 1000 Angstroms.

3. The method of claim 1 wherein forming a plurality of MTJ elements comprises at least one anneal step to set the magnetization direction of a pinned layer therein.

4. The method of claim 1 wherein the BIT ILD layer is comprised of silicon oxide and has a thickness between about 1000 to 5000 Angstroms.

5. The method of claim 1 wherein the top hard mask surface is comprised of Ta.

6. The method of claim 1 wherein forming a plurality of VAC is comprised of a single damascene process in which a plurality of VAC openings is formed in the first etch stop layer and second dielectric layer following by deposition of a diffusion barrier layer as a liner in the VAC openings and then depositing a metal on the diffusion barrier layer to fill the VAC openings.

7. The method of claim 1 wherein each of the plurality of VAM pads has a circular, oval, or rectangular shape from a top-down view.

8. The method of claim 1 wherein step (b) is further comprised of forming a plurality of dummy VAC elements that are coplanar with said VAC elements, step (c) is further comprised of forming a plurality of dummy VAM pads that are coplanar with said VAM pads, and step (d) is further comprised of forming a plurality of dummy MTJs that are coplanar with said MTJ elements but are not electrically connected to a CMOS landing pad.

9. The method of claim 1 wherein each CMOS landing pad is electrically connected to a CMOS transistor in a sub-structure of the substrate.

10. The method of claim 1 wherein each of the plurality of VAM pads has a thickness between about 100 and 500 Angstroms and is a single layer or composite layer comprised of one or more of Ta, TaN, and other conductive materials.

11. The method of claim 1 wherein each VAC is comprised of Cu having a thickness from about 500 to 3000 Angstroms.

* * * * *

UNITED STATES PATENT AND TRADEMARK OFFICE
CERTIFICATE OF CORRECTION

Page 1 of 3

PATENT NO. : 8,183,061 B2
APPLICATION NO. : 12/931648
DATED : May 22, 2012
INVENTOR(S) : Zhong et al.

It is certified that error appears in the above-identified patent and that said Letters Patent is hereby corrected as shown below:

The title page showing the illustrative figure should be deleted to be replaced with the attached title page.

In Figure 8 -- remove layer 13 at the bottom of trenches 71 in Figure 8 --. In Figure 9 -- extend seed layer 90 (and metal layer 92) downward to touch pad 12 in Figure 9 --.

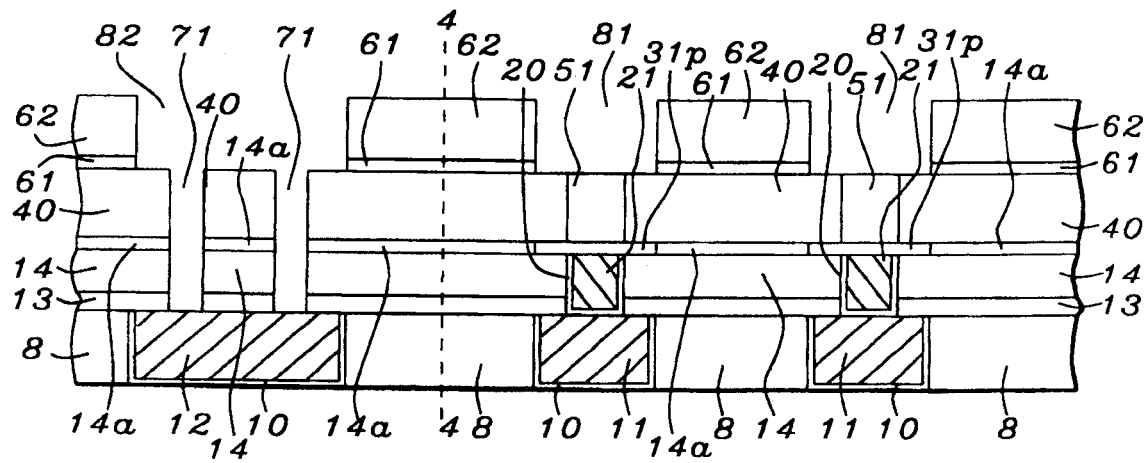

FIG. 8

Signed and Sealed this
Twenty-eighth Day of August, 2012

David J. Kappos
*Director of the United States Patent and Trademark Office*

CERTIFICATE OF CORRECTION (continued)

(12) United States Patent
Zhong et al.

(10) Patent No.: US 8,183,061 B2
(45) Date of Patent: May 22, 2012

(54) HIGH DENSITY SPIN-TRANSFER TORQUE MRAM PROCESS

(75) Inventors: Tom Zhong, Saratoga, CA (US); Chyu-Jiuh Torng, Pleasanton, CA (US); Rongfu Xiao, Fremont, CA (US); Adam Zhong, Milpitas, CA (US); Wai-Ming Johnson Kan, San Ramon, CA (US); Daniel Liu, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 0 days.

(21) Appl. No.: 12/931,648

(22) Filed: Feb. 7, 2011

(65) Prior Publication Data

US 2011/0129946 A1  Jun. 2, 2011

Related U.S. Application Data

(62) Division of application No. 12/290,495, filed on Oct. 31, 2008, now Pat. No. 7,884,433.

(51) Int. Cl.
*H01L 21/441* (2006.01)

(52) U.S. Cl. ............ 438/3; 257/421; 257/E21.577; 257/E21.579; 438/637

(58) Field of Classification Search ............ 257/421, 257/774, E29.323, E23.145, E21.577, E21.579; 438/3, 637, 638
See application file for complete search history.

(56) References Cited

U.S. PATENT DOCUMENTS

| | | | |
|---|---|---|---|
| 6,784,091 B1 * | 8/2004 | Nuetzel et al. | 438/618 |
| 7,381,574 B2 * | 6/2008 | Kim et al. | 438/3 |
| 7,706,175 B2 | 4/2010 | Hosotani et al. | |
| 7,741,688 B2 | 6/2010 | Kajiyama | |
| 2002/0171100 A1 * | 11/2002 | Pohm | 257/310 |
| 2007/0297220 A1 | 12/2007 | Yoshikawa et al. | |
| 2008/0160643 A1 * | 7/2008 | Park et al. | 438/3 |
| 2009/0104718 A1 | 4/2009 | Zhong et al. | |
| 2010/0289098 A1 * | 11/2010 | Li et al. | 257/421 |

OTHER PUBLICATIONS

"Current-driven excitation of magnetic multilayers," by J.C. Slonczewski, Journal of Magnetism and Magnetic Materials, 159 (1996) L1-L7, Elsevier.

"Emission of spin waves by a magnetic multilayer taversed by a current," by L. Berger, Physical Review B, vol. 54, No. 13, Oct. 1, 1996-I, 1996 The American Physical Society, pp. 9353-9358.

* cited by examiner

*Primary Examiner* — Allan R Wilson
(74) *Attorney, Agent, or Firm* — Saile Ackerman LLC; Stephen B. Ackerman

(57) ABSTRACT

A STT-MRAM integration scheme is disclosed wherein the connection between a MTJ and CMOS metal is simplified by forming an intermediate via contact (VAC) on a CMOS landing pad, a metal (VAM) pad that contacts and covers the VAC, and a MTJ on the VAM. A dual damascene process is performed to connect BIT line metal to CMOS landing pads through VAC/VAM/MTJ stacks in a device region, and to connect BIT line connection pads to CMOS connection pads through BIT connection vias outside the device region. The VAM pad is a single layer or composite made of Ta, TaN, or other conductors which serves as a diffusion barrier, has a highly smooth surface for MTJ formation, and provides excellent selectivity with refill dielectric materials during a chemical mechanical polish process. Each VAC is from 500 to 3000 Angstroms thick to minimize additional circuit resistance and minimize etch burden.

11 Claims, 4 Drawing Sheets